United States Patent
Jung et al.

(10) Patent No.: US 11,101,698 B2
(45) Date of Patent: *Aug. 24, 2021

(54) WIRELESS POWER RECEPTION DEVICE AND WIRELESS COMMUNICATION METHOD

(71) Applicant: GE Hybrid Technologies, LLC, Niskayuna, NY (US)

(72) Inventors: Chun-Kil Jung, Seoul (KR); Hak Do Kim, Suwon-si (KR); Sang Youn Noh, Suwon-si (KR)

(73) Assignee: GE Hybrid Technologies, LLC, Niskayuna, NY (US)

(\*) Notice: Subject to any disclaimer, the term of this patent is extended or adjusted under 35 U.S.C. 154(b) by 0 days.

This patent is subject to a terminal disclaimer.

(21) Appl. No.: 16/803,491

(22) Filed: Feb. 27, 2020

(65) Prior Publication Data

US 2020/0204000 A1 Jun. 25, 2020

Related U.S. Application Data

(63) Continuation of application No. 15/313,970, filed as application No. PCT/KR2015/005249 on May 26, 2015, now Pat. No. 10,615,643.

(Continued)

(51) Int. Cl.
*H02J 50/12* (2016.01)
*H02J 7/02* (2016.01)
(Continued)

(52) U.S. Cl.
CPC ............... *H02J 50/12* (2016.02); *H02J 7/007* (2013.01); *H02J 7/00714* (2020.01);
(Continued)

(58) Field of Classification Search
CPC .................................. H02J 50/12; H02J 50/80
See application file for complete search history.

(56) References Cited

U.S. PATENT DOCUMENTS 10,615,643 B2 \* 4/2020 Jung ..................... H02J 50/80
10,615,644 B2   4/2020 Jung et al.
(Continued)

FOREIGN PATENT DOCUMENTS

KR       100971705       7/2010
KR     1020110034664    4/2011
(Continued)

OTHER PUBLICATIONS

"PCT Application No. PCT/KR2015/005249 International Preliminary Report on Patentability", dated Dec. 8, 2016, 11 pages.

(Continued)

*Primary Examiner* — Jeffrey M Shin
(74) *Attorney, Agent, or Firm* — DeLizio Law, PLLC (57) ABSTRACT

A wireless power reception device and a wireless communication method thereby are provided. The wireless communication method by the wireless power reception device may comprise the steps of: receiving a wireless power signal from a wireless power transmission device; measuring the strength of the wireless power signal; modulating the amplitude of the wireless power signal according to the measured strength of the wireless power signal; and performing communication with the wireless power transmission device by using the signal having the amplitude modulated.

15 Claims, 8 Drawing Sheets

Related U.S. Application Data (60) Provisional application No. 62/002,941, filed on May 26, 2014.

(51) Int. Cl.
*H03D 1/10* (2006.01)
*H02J 7/04* (2006.01)
*H02J 50/10* (2016.01)
*H02J 7/00* (2006.01)
*H02J 50/80* (2016.01)
*H02J 50/40* (2016.01)

(52) U.S. Cl.
CPC .............. *H02J 7/025* (2013.01); *H02J 7/042* (2013.01); *H02J 7/045* (2013.01); *H02J 50/10* (2016.02); *H02J 50/80* (2016.02); *H03D 1/10* (2013.01); *H02J 50/40* (2016.02)

(56) References Cited

U.S. PATENT DOCUMENTS

| | | |
|---|---|---|
| 2010/0007307 A1 | 1/2010 | Baarman et al. |
| 2010/0270867 A1 | 10/2010 | Abe |
| 2011/0053500 A1 | 3/2011 | Menegoli et al. |
| 2011/0309689 A1 | 12/2011 | Kamata |
| 2012/0112543 A1 | 5/2012 | Van Wageningen et al. |
| 2012/0155136 A1 | 6/2012 | Von Novak et al. |
| 2012/0161531 A1* | 6/2012 | Kim ........................ H02J 50/80 307/104 |
| 2014/0008990 A1* | 1/2014 | Yoon ........................ G06F 1/26 307/104 |
| 2014/0028244 A1 | 1/2014 | Korekoda |
| 2014/0246923 A1 | 9/2014 | Riehl et al. |
| 2014/0306798 A1 | 10/2014 | Jeon et al. |
| 2017/0201127 A1 | 7/2017 | Jung et al. |
| 2017/0201128 A1 | 7/2017 | Jung et al. |
| 2020/0203999 A1 | 6/2020 | Jung et al. |

FOREIGN PATENT DOCUMENTS

| | | |
|---|---|---|
| KR | 1020120052291 | 5/2012 |
| KR | 101169185 | 7/2012 |
| KR | 1020120073236 | 7/2012 |
| KR | 1020120132375 | 12/2012 |
| KR | 1020130087976 | 8/2013 |
| WO | 2013176751 | 11/2013 |

OTHER PUBLICATIONS

"PCT Application No. PCT/KR2015/005252 International Preliminary Report on Patentability", dated Dec. 8, 2016, 12 pages.

"PCT Application No. PCT/KR2015/005252 International Search Report", dated Aug. 17, 2015, 3 pages.

"PCT Application No. PCTKR2015005249 International Search Report", dated Jul. 29, 2015, 2 pages.

"Qi System Description Wireless Power Transfer", Wireless Power Consortium, vol. 1:Low Power, Part 1:Interface Definition, Version 1.0.1, Oct. 2010, 88 pages.

"U.S. Appl. No. 15/313,970 Final Office Action", dated Apr. 11, 2019, 6 pages.

"U.S. Appl. No. 15/313,970 Office Action", dated Jul. 18, 2019, 5 pages.

"U.S. Appl. No. 15/313,970 Office Action", dated Aug. 1, 2018, 15 pages.

"U.S. Appl. No. 15/313,972 Final Office Action", dated Jan. 29, 2019, 12 pages.

"U.S. Appl. No. 15/313,972 Final Office Action", dated Apr. 24, 2019, 6 pages.

"U.S. Appl. No. 15/313,972 Office Action", dated Jul. 17, 2019, 6 pages.

"U.S. Appl. No. 15/313,972 Office Action", dated Jul. 31, 2018, 11 pages.

"U.S. Appl. No. 16/803,475 Office Action", dated Sep. 23, 2020, 9 pages.

* cited by examiner

WIRELESS POWER RECEPTION DEVICE AND WIRELESS COMMUNICATION METHOD

RELATED MATTERS

This application is a continuation of, and claims priority benefit of, U.S. patent application Ser. No. 15/313,970, filed Nov. 25, 2016, which is the National Stage of PCT International Application No. PCT/KR2015/005249 filed May 26, 2015, which claims the priority benefit of U.S. Provisional Patent Application No. 62/002,941, filed May 26, 2014. The disclosures of which are incorporated herein by reference.

BACKGROUND

Technical Field

Embodiments of the present disclosure relate to a wireless power receiving apparatus receiving wireless power from a wireless power transmitting apparatus and a wireless communication method thereby.

Related Art

In recent years, supply of portable electronic devices including a smart phone, a laptop, an MPEG-1 audio layer (MP3) player, a headset, and the like has been spread. However, since the portable electronic devices operate by consuming power stored in battery cells (e.g., a primary cell, a secondary cell, and the like), the battery cell needs to be charged or replaced in order to continuously operate the portable electronic devices.

A method of charging the battery cell is generally divided into a contact type charging method of charging the battery cell by using a power supply line and a power supply terminal and a non-contact type charging method of charging the battery cell with wireless power induced by a magnetic field generated from a primary coil of a wireless power transmitting apparatus by using a wireless power receiving apparatus. However, in the contact type charging method, an instant discharge phenomenon occurs as different potential differences are generated at both terminals when a charger and a battery are coupled to or separated from each other and the power supply terminal is exposed to the outside, and as a result, fire may occur when foreign materials are accumulated in the power supply terminal and the battery is naturally discharged and the life-span and the performance of the battery deteriorate due to moisture. Accordingly, in recent years, in order to solve the problems, a research into the non-contact type charging method has been in active progress.

As one of technologies associated with the non-contact type charging method, "Non-contact Charging System" of Korean Patent Registration No. 10-0971705 discloses that a wireless power signal is transmitted by determining measuring a delay time up to a time of receiving a response signal corresponding to a request signal from a time of outputting the request signal through a primary-side core unit and comparing the measured delay time with a reference stand-by time when a load change is sensed in the primary-side core unit of a non-contact power transmitting apparatus and thereafter, determining that a corresponding object is a foreign material when the measured time is shorter than the reference stand-by time and determining that the corresponding object is a normal non-contact power receiving apparatus when the measured time is longer than the reference stand-by time.

In the magnetic induction type non-contact charging system, the wireless power receiving apparatus generally communicates with the wireless power transmitting apparatus by an amplitude-shift keying (ASK) modulation method. In detail, when an amplitude of the wireless power signal which the wireless power receiving apparatus receives from the wireless power transmitting apparatus is modulated, the modulated signal is induced to a transmitting coil of the wireless power transmitting apparatus. The wireless power transmitting apparatus performs communication by detecting the modulated signal induced to the transmitting coil. However, in the non-contact charging system, as the strength of the wireless power signal transmitted from the wireless power transmitting apparatus increases, distortion occurs in the modulated signal and this causes a communication error between the wireless power transmitting apparatus and the wireless power receiving apparatus.

SUMMARY

The present disclosure provides a wireless power receiving apparatus which can smoothly communicate with a wireless power transmitting apparatus even when the strength of wireless power transmitted from the wireless power transmitting apparatus increases in a non-contact charging system.

The present disclosure also provides a wireless communication method which enables a wireless power receiving apparatus and a wireless power transmitting apparatus to smoothly communicate with each other even when the strength of wireless power transmitted from the wireless power transmitting apparatus increases in a non-contact charging system.

In an aspect, a wireless communication method by a wireless power receiving apparatus includes: receiving a wireless power signal from a wireless power transmitting apparatus; measuring the strength of the wireless power signal; modulating the amplitude of the wireless power signal according to the strength of the measured wireless power signal; and performing communication with the wireless power transmitting apparatus by using the signal having the amplitude modulated.

The modulating of the amplitude of the wireless power signal may include selecting at least one of a plurality of modulators included in the wireless power receiving apparatus according to the measured strength of the wireless power signal.

Each of the plurality of modulators may include at least one capacitor or resistor and includes at least one transistor.

The at least one transistor may be a metal oxide silicon field effect transistor (MOSFET).

The plurality of modulators may be configured to an alternating current (AC) terminal of the wireless power receiving apparatus and is connected to a controller of the wireless power receiving apparatus in parallel.

At least one modulator of the plurality of modulators may be configured in a direct current (DC) terminal of the wireless power receiving apparatus.

The modulating of the amplitude of the wireless power signal may include controlling a gate bias of the modulator included in the wireless power receiving apparatus according to the measured strength of the wireless power signal.

The modulator may include a plurality of resistors and at least one transistor.

In another aspect, a wireless power receiving apparatus includes: at least one secondary core receiving a wireless power signal transmitted from a wireless power transmitting apparatus; a detection circuit measuring the strength of the wireless power signal; a plurality of modulators modulating the amplitude of the wireless power signal; and a controller selecting at least one of the plurality of modulators based on the measured strength of the wireless power signal and controlling communication with the wireless power transmitting apparatus by using the signal having the amplitude modulated.

In yet another aspect, a wireless power receiving apparatus includes: at least one secondary core receiving a wireless power signal transmitted from a wireless power transmitting apparatus; a detection circuit measuring the strength of the wireless power signal a modulator modulating the amplitude of the wireless power signal; and a controller controlling a gate bias of the modulator based on the measured strength of the wireless power signal and controlling communication with the wireless power transmitting apparatus by using the signal having the amplitude modulated by the modulator.

Since a wireless power receiving apparatus modulates the amplitude of a wireless power signal according to the strength of the wireless power signal transmitted from a wireless power transmitting apparatus to prevent a modulated signal from being distorted, smooth wireless communication is available even when wireless power signals of various strength are transmitted.

DESCRIPTION OF EXEMPLARY EMBODIMENTS

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure. In addition, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising", will be understood to imply the inclusion of stated elements but not the exclusion of any other elements.

A term called "wireless power" used in the present specification means predetermined type of energy associated with an electric field, a magnetic field, an electromagnetic field, and the like transmitted from a transmitter to a receiver without using physical electromagnetic conductors. The wireless power may be called a power signal or a wireless power signal and mean an oscillating magnetic flux enclosed by a primary coil at a transmitting side and a secondary coil at a receiving side. Hereinafter, a wireless power receiving apparatus and a wireless communication method in a non-contact charging system for wirelessly charging devices including a mobile phone, a cordless phone, a smart phone, an MP3 player, a laptop, a headset, and the like will be described as an example. A fundamental principle of wireless power transmission includes both a magnetic induction coupling method and a magnetic resonance coupling (that is, resonance induction) method using frequencies less than 30 MHz. However, various frequencies including frequencies at which a license-exemption operation is permitted at comparative higher radiation levels, for example, less than 135 kHz (low frequency, LF) or 13.56 MHz (high frequency, HF) may be used.

Figure 1:
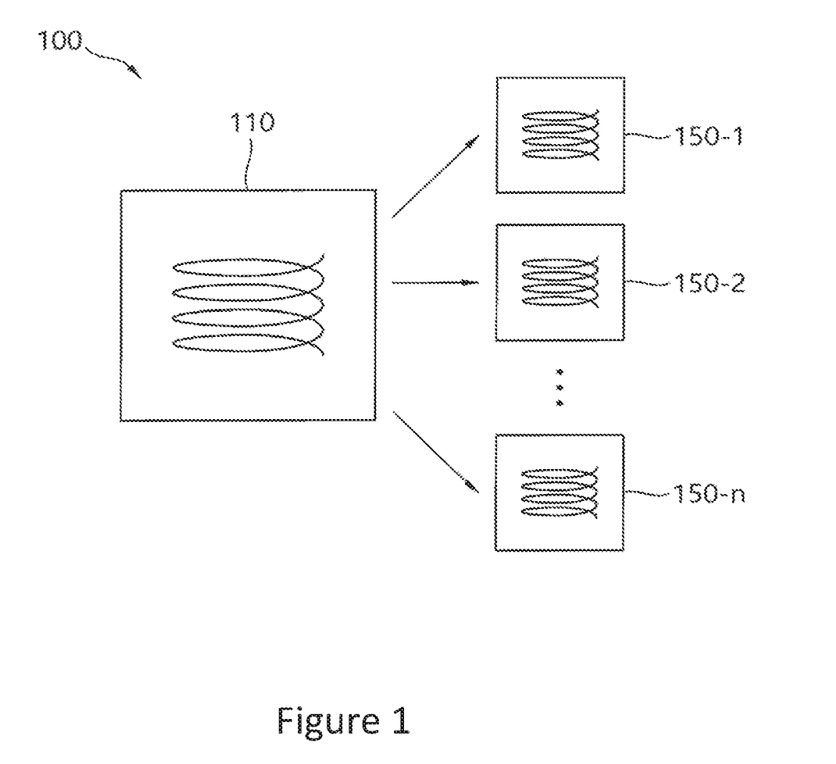
FIG. 1 is a diagram illustrating a non-contact charging system according to the present disclosure.

FIG. 1 is a diagram illustrating a non-contact charging system according to the present disclosure.

Referring to FIG. 1, the non-contact charging system 100 includes a wireless power transmitting apparatus 110 and one or more wireless power receiving apparatus 150-1 to 150-n (herein, n is a natural number).

The wireless power transmitting apparatus 110 includes a primary core. The primary coil may include at least one primary coil. The wireless power transmitting apparatus 110 may have a predetermined appropriate shape, but one preferred embodiment may be a flat platform having a power transmission surface. The respective wireless power receiving apparatuses 150-1 to 150-n are positioned on the platform or near the platform to receive wireless power from the wireless power transmitting apparatus 110.

The respective wireless power receiving apparatuses 150-1 to 150-n may be separated from the wireless power transmitting apparatus 110. When the respective wireless power receiving apparatuses 150-1 to 150-n are positioned near the wireless power transmitting apparatus 110, the respective wireless power receiving apparatuses 150-1 to 150-n include the secondary core coupled with an electromagnetic field generated by the primary core of the wireless power transmitting apparatus 110. The secondary core may include one or more secondary coils.

The wireless power transmitting apparatus 110 transmits power to the wireless power receiving apparatuses 150-1 to 150-n without a code contact. In this case, the primary core and the secondary core are magnetic induction coupled or magnetic resonance coupled to each other. The primary coil or the secondary coil may have predetermined appropriate shapes. As one example, the primary coil and the secondary coil may be copper wires wound around ferrite or an amorphous material.

The wireless power receiving apparatuses 150-1 to 150-n are connected with external load (not illustrated, also referred to as an actual load of the wireless power receiving apparatus) to supply the power wirelessly received from the wireless power transmitting apparatus 110 to the external load. For example, each of the wireless power receiving apparatuses 150-1 to 150-$n$ may transport the received power to an object which consumes or stores the power, such as a portable electric or electronic device or a rechargeable battery cell or battery.

Figure 2:
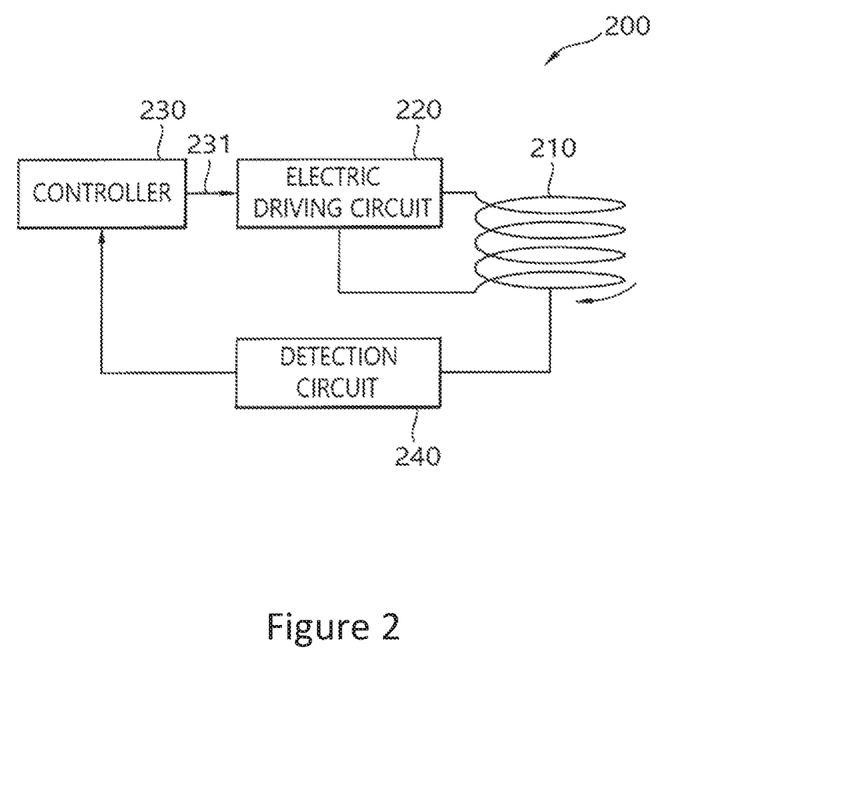
FIG. 2 is a block diagram illustrating a wireless power transmitting apparatus included in the non-contact charging system.

FIG. 2 is a block diagram illustrating a wireless power transmitting apparatus included in the non-contact charging system. Hereinafter, the wireless power transmitting apparatus will be described in more detail with reference to FIG. 2.

The wireless power transmitting apparatus 200 may include a primary core 210, an electric driving circuit 220, a controller 230, and a detection circuit 240.

The primary core 210 transmits a signal for detecting the wireless power receiving apparatus and a wireless power signal.

The electric driving circuit 220 is connected to the primary core 210 to apply electric driving signals to the primary core so that the electromagnetic field is generated in the primary core 210.

The controller 230 is connected to the electric driving circuit 220 to generate a control signal 231 to control an alternating current (AC) signal required when the primary core 210 generates an induction magnetic field or causes magnetic resonance. The controller 230 may control an operation frequency, and voltage, current, and/or a duty cycle in the wireless power transmitting apparatus 200 according to a power control signal received from the wireless power receiving apparatus.

The detection circuit 240 measures current that flows on the primary core 220. The current measured by the detection circuit 240 may be alternating current (AC) or direct current (DC). As one example, the detection circuit 240 may be a current sensor or a voltage sensor. Alternatively, the detection circuit may be a transformer that lowers high current that flows on the primary core 210 to low current and uses the low current.

The controller 230 may obtain information transmitted by the wireless power receiving apparatus by using a current or voltage value measured by the detection circuit 240. The wireless power receiving apparatus may continuously or periodically transmit to the wireless power transmitting apparatus 200 a power control signal to request an increase of the power or a power control signal to request a decrease of the power until required power is satisfied by varying the load. When the wireless power transmitting apparatus 200 receives the power control signal to request the increase of the power from the wireless power receiving apparatus through the load variation, the wireless power transmitting apparatus 200 decreases the power controls to an appropriate strength by using the transformer or a voltage distributor using resistance, and the like and performs envelope detection by using a detector and thereafter, makes the power control signal pass through a low-pass filter to detect the signal form the wireless power receiving apparatus. In addition, the strength of the current which flows on the primary core 210 may be increases so as to transmit higher power as a response to the power control signal. In more detail, the controller 230 may adjust the control signal so as to apply an AC signal having a larger than a reference AC signal in order to make higher current to flow on the primary core 210. On the contrary, when the controller 230 receives the power control signal to request the decrease of the power from the wireless power receiving apparatus, the controller 230 may adjust the control signal so as to an AC signal lower than the reference AC signal so that power lower than the current transmission power is transmitted.

Figure 3:
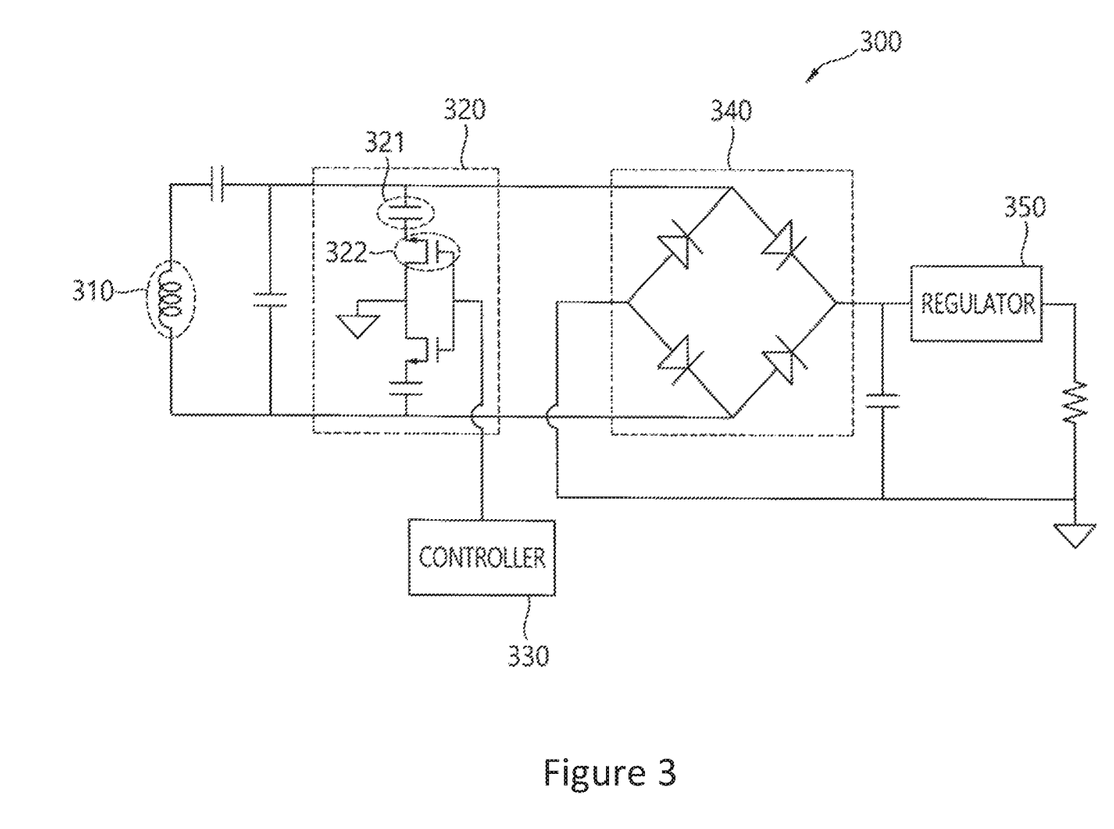
FIG. 3 is a circuit diagram illustrating a wireless power receiving apparatus included in the non-contact charging system.

FIG. 3 is a circuit diagram illustrating a wireless power receiving apparatus included in the non-contact charging system. Hereinafter, a structure of a wireless power receiving apparatus will be described in more detail with reference to FIG. 3.

A wireless power receiving apparatus 300 may include a secondary core 310, a modulator 320, a controller 330, a rectifier 340, and a regulator 350.

The secondary core 310 may be configured by at least one secondary coil. The secondary core 310 may receive a wireless power signal transmitted from the primary core of the wireless power transmitting apparatus.

The modulator 320 may be configured by an AC terminal of the wireless power receiving apparatus 300 as illustrated in FIG. 3 and modulate an amplitude of the wireless power signal received through the secondary core 310. To this end, the modulator 320 may include a capacitor 321 and a transistor 322. For example, the modulator 320 turns on/off the transistor 322 connected to the capacitor 321 to modulate the amplitude of the wireless power signal received through the secondary core 310. The signal with the modulated amplitude may be induced to the primary core of the wireless power transmitting apparatus through the secondary core 310.

The controller 330 is to control an operation of the wireless power receiving apparatus 300, and for example, may control power supplied to a load (not illustrated) connected to the wireless power receiving apparatus 300. Further, the controller 330 may perform communication with the wireless power transmitting apparatus by controlling the modulator 320.

The rectifier 340 may rectify AC power received by the secondary core 310 to direct current (DC) power. The power rectified by the rectifier 340 may be supplied to a load which is connected, installed, or included to the wireless power receiving apparatus 300 by the regulator 350. The rectifier 340 may be implemented by a half-bridge, a full-bridge, or the like as illustrated in FIG. 3. In FIG. 3, as an example, the rectifier 340 includes a plurality of diodes, but the diode of the rectifier 340 may be replaced with the transistor such as a field effect transistor (FET).

The regulator 350 is configured by an output terminal of the rectifier 340 and may be regulated at low voltage so as to supply high voltage and/or irregular voltage output from the rectifier 340 as stable power.

Meanwhile, although not illustrated in FIG. 3, the wireless power receiving apparatus 300 may include a detection circuit which measures strength of the wireless power signal transmitted from the wireless power transmitting apparatus by monitoring an output of the rectifier 340.

When the strength of the wireless power signal detected from the detection circuit is larger than or smaller than a predetermined control point, the controller 330 may transmit information on power control so that the wireless power signal with predetermined strength may be received by modulating the amplitude of the wireless power signal received from the wireless power receiving apparatus. Alternatively, when the strength of the wireless power signal detected from the detection circuit is beyond the predetermined range, the controller 330 may allow the strength of the wireless power signal to be maintained within the predetermined range by modulating the amplitude of the wireless power signal received from the wireless power transmitting apparatus. In this case, as illustrated in FIG. 3, when the capacitor 321 is used in the modulator 320, constant impedance for a change in frequency is maintained, and thus even though the frequency is changed, the modulator 320 may perform constant amplitude modulation. However, when a resistor instead of the capacitor 321 is used in the modulator 320, a response time may be minimized according to the used resistor, but since the impedance is changed according to a frequency, when a full band is used, distortion according to a frequency may be caused. Further, even though the capacitor 321 is used in the modulator 320, the size of the power received from the wireless power transmitting apparatus is larger than a predetermined value and the signal modulated by the modulator 320 may be distorted. The distortion of the modulated signal causes communication failure between the wireless power transmitting apparatus and the wireless power receiving apparatus 300.

Figure 4:
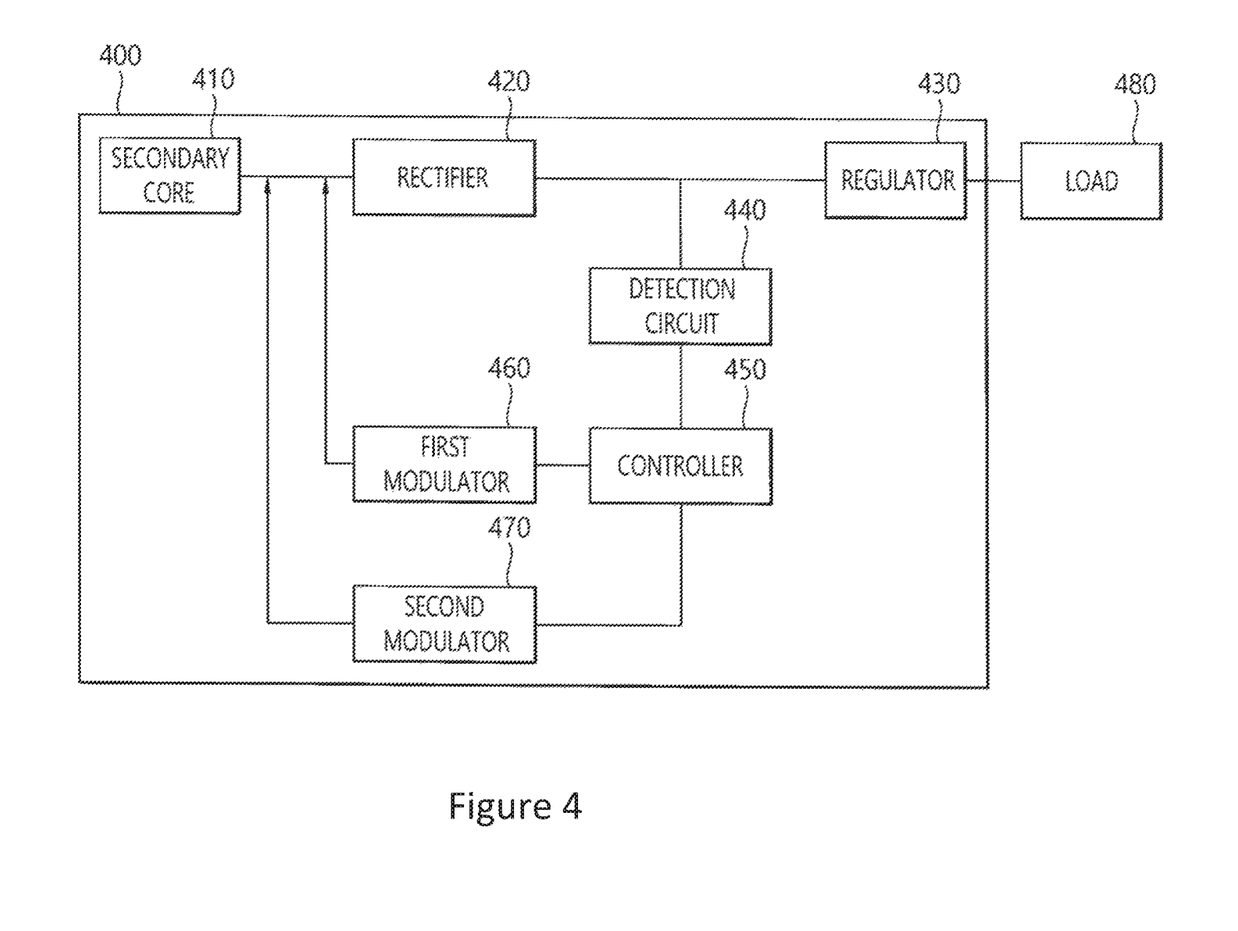
FIG. 4 is a block diagram illustrating a wireless power receiving apparatus according to an embodiment of the present disclosure.
Figure 5:
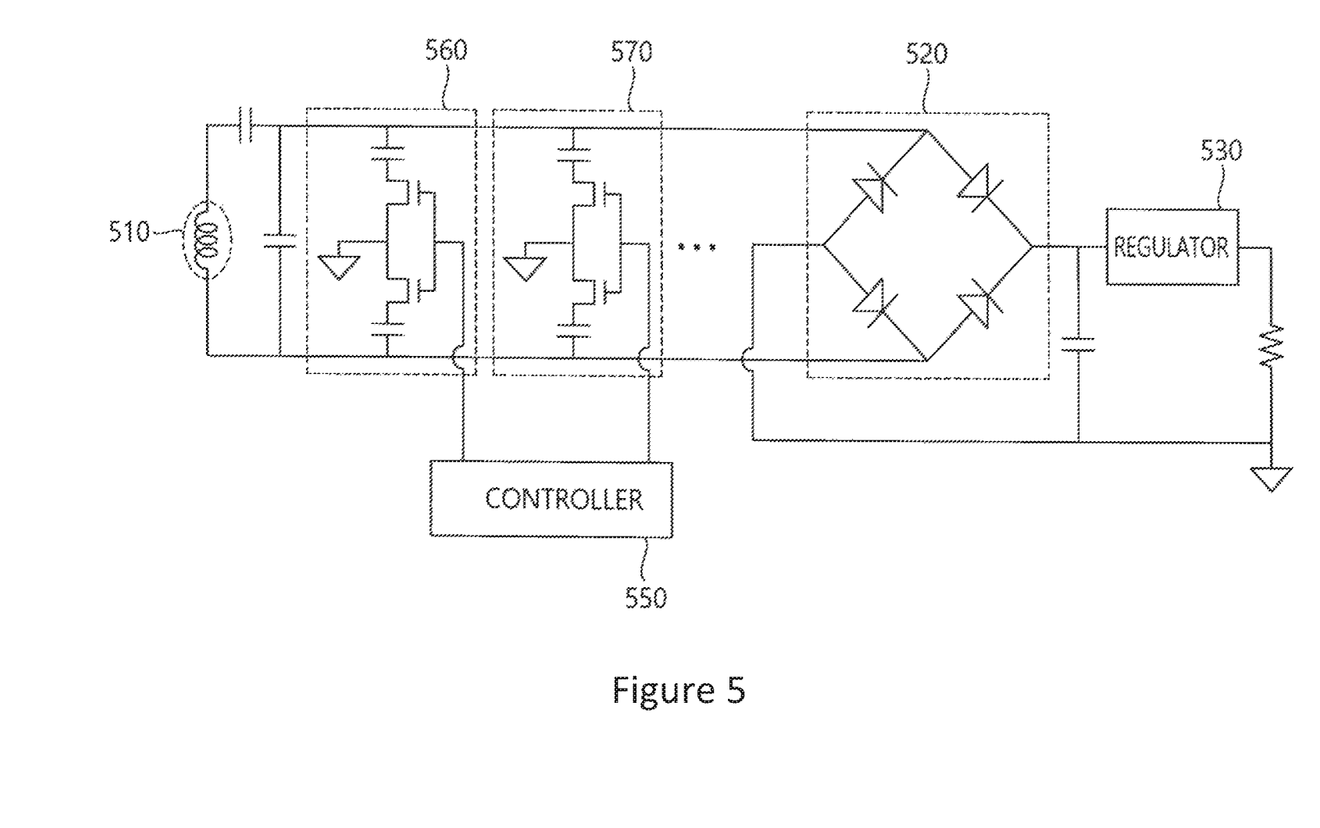
FIG. 5 is a circuit diagram illustrating the wireless power receiving apparatus according to the embodiment of the present disclosure.

FIG. 4 is a block diagram illustrating a wireless power receiving apparatus according to an embodiment of the present disclosure and FIG. 5 is a circuit diagram illustrating the wireless power receiving apparatus according to the embodiment of the present disclosure. Hereinafter, the wireless power receiving apparatus will be described in detail with reference to FIGS. 4 and 5.

First, referring to FIG. 4, a wireless power receiving apparatus 400 according to an embodiment of the present disclosure may include a secondary core 410, a rectifier 420, a regulator 430, a detection circuit 440, a controller 450, and a plurality of modulators 460 and 470. The wireless power receiving apparatus 400 is connected to an external load 480 to supply power wirelessly received from the wireless power transmitting apparatus to a load 480. In FIGS. 4 and 5, as an example, it is illustrated that two modulators 460 and 470 are included in the wireless power receiving apparatus 400, but the wireless power receiving apparatus 400 may include two or more modulators.

The secondary core 410 may include at least one secondary coil receiving a wireless power signal transmitted from the wireless power transmitting apparatus.

The rectifier 420 may rectify the wireless power signal received by the secondary core 410. In detail, the rectifier 420 may convert an AC-waveform wireless power signal received by the secondary core 410 into DC power by using full-wave or half-wave rectification.

The regulator 430 is configured by an output terminal of the rectifier 420 and may be regulated at low voltage so as to supply high voltage and/or irregular voltage output from the rectifier 420 as stable power.

The detection circuit 440 is connected to an output terminal of the rectifier 420 to measure the strength of the wireless power signal transmitted from the wireless power transmitting apparatus by monitoring the DC voltage output from the rectifier 420.

The controller 450 selects any one or at least one of the plurality of modulators 460 and 470 based on the strength of the wireless power signal measured by the detection circuit 440 and may control communication with the wireless power transmitting apparatus by using a signal with the amplitude modulated by the selected modulator.

The respective modulators 460 and 470 may modulate the amplitude of the wireless power signal transmitted from the wireless power transmitting apparatus. Herein, the respective modulators 460 and 470 may be used in the amplitude modulation for signals with different power. For example, the first modulator 460 may be used in the amplitude modulation of the corresponding signal when the strength of the wireless power signal received from the wireless power transmitting apparatus is a control point or more based on the value measured in the output terminal of the regulator 430, and the second modulator 470 may be used in the amplitude modulation of the corresponding signal when the strength of the wireless power signal is less than the control point. Herein, the control point may be set to various values according to the strength of the wireless power signal.

When three modulators are configured in the wireless power receiving apparatus 400, any one of the three modulators may be used in the amplitude modulation when the wireless power signal is less than a first control point, another one of the three modulators may be used in the amplitude modulation when the wireless power signal is equal to or more than a second control point, and the other one of the three modulators may be used in the amplitude modulation when the wireless power signal is equal to or more than the first control point and less than the second control point.

The controller 450 may generate charge control information, charge status information, full charge information, and the like by using the modulator selected from the plurality of modulators 460 and 470. The charge control information may be transmitted to the wireless power transmitting apparatus through a control error packet. The charge status information may be transmitted to the wireless power transmitting apparatus through a charge status packet. The full charge information may be transmitted to the wireless power transmitting apparatus through an end power transfer packet.

Hereinafter, a structure of the wireless power transmitting apparatus including two modulators 560 and 570 will be described in more detail with reference to FIG. 5. In FIG. 5, as an example, a case where a secondary core 510 includes one secondary coil is illustrated.

Referring to FIG. 5, respective modulators 560 and 570 may be connected to the controller 550 in parallel and may include at least one capacitor and at least one transistor. In FIG. 5, as an example, a case where the respective modulators 560 and 570 include two capacitors and two transistors is illustrated. Herein, the transistor may be a field effect transistor (FET) or a metal oxide silicon field effect transistor (MOSFET). The respective modulators 560 and 570 may modulate the amplitude of the wireless power signal received through the secondary core 510 and/or the size of the amplitude according to a change amount of the load by turning on/off the transistors connected to the capacitor.

In FIG. 5, the capacitor included in the respective modulators 560 and 570 may be replaced with a resistor. That is, the respective modulators 560 and 570 may include a plurality of resistors and a plurality of transistors. In this case, when the modulator modulates the amplitude of the wireless power signal, a time taken to store charges when using the capacitor is not required, and thus the response time of the wireless power receiving apparatus may be minimized.

Meanwhile, in FIG. 5, a case where a plurality of modulators 560 and 570 is configured in an AC terminal of the wireless power receiving apparatus is illustrated, but the plurality of modulators 560 and 570 may be configured in a DC terminal (for example, between the rectifier 520 and the regulator 530) of the wireless power receiving apparatus. Some of the plurality of modulators 560 and 570 may be configured in the AC terminal and the rest thereof may be configured in the DC terminal.

Figure 6:
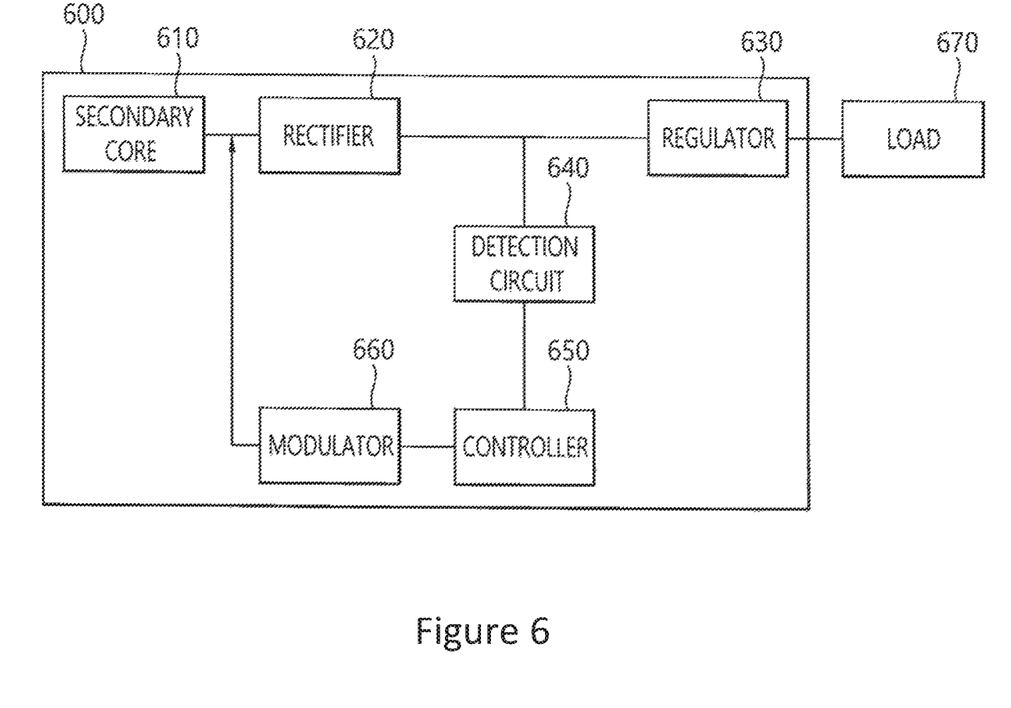
FIG. 6 is a block diagram illustrating a wireless power receiving apparatus according to another embodiment of the present disclosure.
Figure 7:
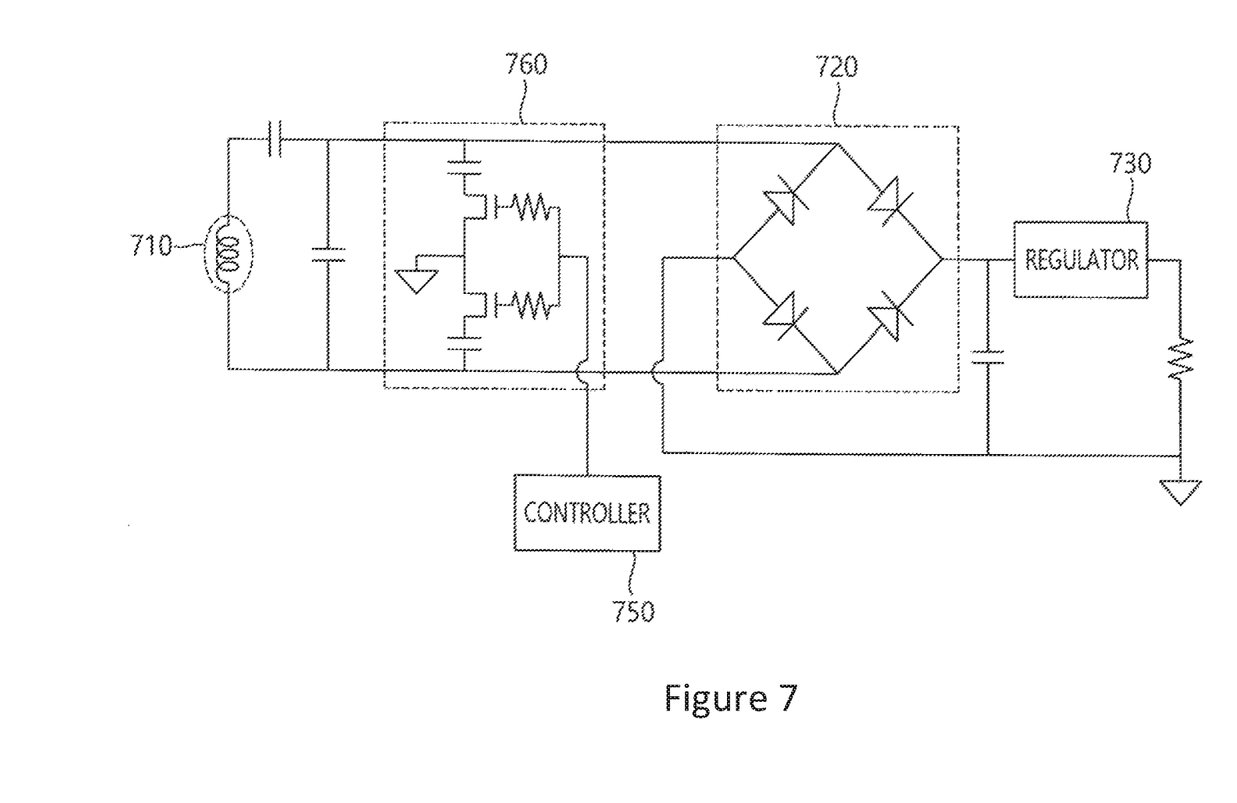
FIG. 7 is a circuit diagram illustrating the wireless power receiving apparatus according to another embodiment of the present disclosure.

FIG. 6 is a block diagram illustrating a wireless power receiving apparatus according to another embodiment of the present disclosure and FIG. 7 is a circuit diagram illustrating the wireless power receiving apparatus according to another embodiment of the present disclosure. Hereinafter, a wireless power receiving apparatus according to another embodiment of the present disclosure will be described in detail with reference to FIGS. 6 and 7.

First, referring to FIG. 6, a wireless power receiving apparatus 600 according to another embodiment of the present disclosure may include a secondary core 610, a rectifier 620, a regulator 630, a detection circuit 640, a controller 650, and a modulator 660. The wireless power receiving apparatus 600 according to the embodiment in FIG. 6 may also supply power to an external load 670.

The secondary core 610 may include at least one secondary coil receiving a wireless power signal transmitted from the wireless power transmitting apparatus.

The rectifier 620 may rectify the wireless power signal received by the secondary core 610. In detail, the rectifier 620 may convert an AC-waveform wireless power signal received by the secondary core 610 into DC power by using wave rectification.

The regulator 630 is configured by an output terminal of the rectifier 620 and may be regulated at low voltage so as to supply high voltage and/or irregular voltage output from the rectifier 620 as stable power.

The detection circuit 640 is connected to an output terminal of the rectifier 620 to measure the strength of the wireless power signal transmitted from the wireless power transmitting apparatus by monitoring the DC voltage output from the rectifier 620.

The controller 650 may actively control a gate bias of the modulator 660 based on the strength of the wireless power signal measured in the detection circuit 640. Herein, the gate bias may be defined as DC voltage or current applied between a gate and a source or substrate of a transistor (for example, a MOSFET) in the modulator 660. For example, the controller may control a gate bias Vgs to be 3.3 V, 3 V, 2.5 V, and 2 V according to the strength of the wireless power signal. To this end, the controller 650 may include at least one capacitor, at least one transistor, and at least one resistor.

The controller 650 controls the gate bias of the modulator 660 to generate charge control information, charge status information, full charge information, and the like and may transfer the generated information to the wireless power transmitting apparatus through the secondary core 610.

Hereinafter, a structure of the wireless power transmitting apparatus according to another embodiment of the present disclosure will be described in more detail with reference to FIG. 7. In FIG. 7, as an example, a case where a secondary core 710 includes one secondary coil is illustrated.

Referring to FIG. 7, a modulator 760 may be connected to a controller 750 and for example, may include two capacitors, two transistors, and two resistors. Herein, the transistor may be a FET or MOSFET.

In FIG. 7, the capacitor included in the modulator 760 may also be replaced with a resistor. That is, the modulator 760 may also include a plurality of resistors and a plurality of transistors. In this case, when the modulator 760 modulates the amplitude of the wireless power signal, a time taken to store the charges like when using the capacitor is not required. Accordingly, the response time of the wireless power receiving apparatus may be minimized.

Meanwhile, in FIG. 7, the case where the modulator 760 is configured in the AC terminal of the wireless power receiving apparatus is illustrated, but the modulator 760 may be configured in the DC terminal (for example, between the rectifier 720 and the regulator 730) of the wireless power receiving apparatus.

Figure 8:
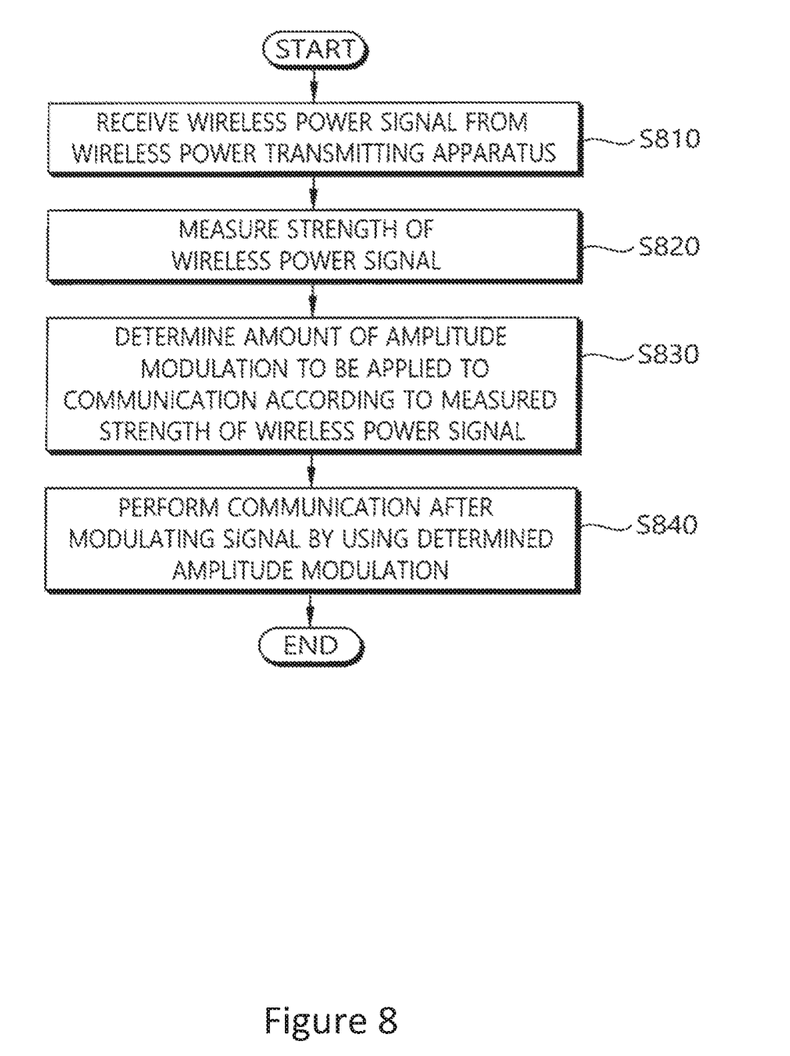
FIG. 8 is a flowchart illustrating a wireless communication method of a wireless power receiving apparatus according to an embodiment of the present disclosure.

FIG. 8 is a flowchart illustrating a wireless communication method of a wireless power receiving apparatus according to an embodiment of the present disclosure. Hereinafter, a wireless communication method of a wireless power receiving apparatus according to the present disclosure will be described in more detail with reference to FIG. 8.

The wireless power receiving apparatus according to the present disclosure receives a wireless power signal from a wireless power transmitting apparatus (S810) and then may measure strength of the wireless power signal (S820). In addition, according to strength of the wireless power signal measured for stable communication with the wireless power transmitting apparatus, a quantity of the amplitude modulation to be applied in communication with the wireless power transmitting apparatus may be determined (S830).

As an example, the wireless power receiving apparatus may select any one or at least one of a plurality of modulators included in the wireless power receiving apparatus according to the measured strength of the wireless power signal and modulate the amplitude of the wireless power signal by using the selected modulator. In this case, the plurality of modulators may include at least one capacitor or resistor and at least one transistor as illustrated in FIG. 5, respectively. Herein, the at least one transistor may be implemented by a FET, a MOSFET, or the like. Meanwhile, the plurality of modulators may be configured in an AC terminal or a DC terminal of the wireless power receiving apparatus. In addition, the plurality of modulators may be connected to the controller of the wireless power receiving apparatus in parallel. In FIG. 5, the capacitor included in each modulator may be replaced with a resistor in order to reduce a response time of the wireless power receiving apparatus.

As another example, the wireless power receiving apparatus may actively control a gate bias of one modulator included in the wireless power receiving apparatus according to the measured strength of the wireless power signal. To this end, one modulator may include a plurality of resistors and at least one transistor as illustrated in FIG. 7. One modulator may be configured in an AC terminal or a DC terminal of the wireless power receiving apparatus and a capacitor included in one modulator may also be replaced with a resistor in order to reduce the response time of the wireless power receiving apparatus.

The wireless power receiving apparatus may modulate a signal by using the determined amplitude modulation and then perform communication with the wireless power transmitting apparatus. Particularly, the signal with the modulated amplitude is induced to the primary core of the wireless power transmitting apparatus from the secondary core of the wireless power receiving apparatus, and the wireless power transmitting apparatus may control transmission power by detecting the signal induced in the primary core.

The above description just illustrates the technical spirit of the present disclosure and various changes and modifications can be made by those skilled in the art to which the present disclosure pertains without departing from an essential characteristic of the present disclosure. Therefore, the embodiments disclosed in the present disclosure are used to not limit but describe the technical spirit of the present disclosure and the scope of the technical spirit of the present disclosure is not limited by the embodiments. The scope of the present disclosure should be interpreted by the appended claims and it should be analyzed that all technical spirit in the equivalent range thereto is intended to be embraced by the scope of the present disclosure.

The invention claimed is:

1. A method by a wireless power receiving apparatus, the method comprising:
   receiving a wireless power signal from a wireless power transmitting apparatus;
   selecting a first modulator from among a plurality of modulators included in the wireless power receiving apparatus based on a strength of the wireless power signal, wherein the first modulator is selected when the strength of the wireless power signal is above a control point; and
   communicating with the wireless power transmitting apparatus using the first modulator to modulate an amplitude of the wireless power signal.

2. The method of claim 1, wherein the control point is a predetermined value representing a threshold for selecting the first modulator.

3. The method of claim 1, further comprising:
   wherein the first modulator is different from a second modulator usable when the strength of the wireless power signal is below the control point.

4. The method of claim 1, wherein the first modulator includes at least one transistor and further includes a resistor that replaces a capacitor that would otherwise be included in a traditional modulator design.

5. The method of claim 4, wherein the at least one transistor is a metal oxide silicon field effect transistor (MOSFET).

6. The method of claim 1, wherein the first modulator is coupled to an alternating current (AC) terminal of the wireless power receiving apparatus and is connected in parallel to a controller of the wireless power receiving apparatus.

7. The method of claim 1, wherein the first modulator is coupled to a direct current (DC) terminal of the wireless power receiving apparatus.

8. The method of claim 1, further comprising:
   setting a configurable gate bias of the first modulator based on the strength of the wireless power signal, wherein the configurable gate bias is selected from a group consisting of 3.3 volts, 3 volts, 2.5 volts, and 2 volts, the configurable gate bias selected in relation to the strength of the wireless power signal.

9. A wireless power receiving apparatus comprising:
   at least one secondary core configured to receive a wireless power signal transmitted from a wireless power transmitting apparatus;
   a plurality of modulators including at least a first modulator and a second modulator; and
   a controller configured to select the first modulator from among the plurality of modulators based on a strength of the wireless power signal, wherein the first modulator is selected when the strength of the wireless power signal is above a control point, the controller configured to communicate with the wireless power transmitting apparatus using the first modulator to modulate an amplitude of the wireless power signal.

10. The wireless power receiving apparatus of claim 9, wherein the control point is a predetermined value representing a threshold for selecting the first modulator.

11. The wireless power receiving apparatus of claim 10, wherein the first modulator is different from a second modulator usable when the strength of the wireless power signal is below the control point.

12. The wireless power receiving apparatus of claim 9, wherein the first modulator includes at least one transistor and further includes a resistor that replaces a capacitor that would otherwise be included in a traditional modulator design.

13. The wireless power receiving apparatus of claim 12, wherein the at least one transistor is a metal oxide silicon field effect transistor (MOSFET).

14. The wireless power receiving apparatus of claim 9, wherein the first modulator is coupled to an AC terminal or DC terminal of the wireless power receiving apparatus.

15. The wireless power receiving apparatus of claim 9, wherein the controller is further configured to set a configurable gate bias of the first modulator based on the strength of the wireless power signal, wherein the configurable gate bias is selected from a group consisting of 3.3 volts, 3 volts, 2.5 volts, and 2 volts, the configurable gate bias selected in relation to the strength of the wireless power signal.

\* \* \* \* \*